(12) United States Patent
Fujiwara

(10) Patent No.: US 7,695,023 B2
(45) Date of Patent: Apr. 13, 2010

(54) VACUUM FEEDING JOINT

(75) Inventor: Teruhiko Fujiwara, Tokyo (JP)

(73) Assignee: Koganei Corporation, Tokyo (JP)

( * ) Notice: Subject to any disclaimer, the term of this patent is extended or adjusted under 35 U.S.C. 154(b) by 143 days.

(21) Appl. No.: 10/545,471

(22) PCT Filed: Feb. 10, 2004

(86) PCT No.: PCT/JP2004/001392

§ 371 (c)(1),
(2), (4) Date: Aug. 12, 2005

(87) PCT Pub. No.: WO2004/072517

PCT Pub. Date: Aug. 26, 2004

(65) Prior Publication Data

US 2008/0012304 A1    Jan. 17, 2008

(30) Foreign Application Priority Data

Feb. 12, 2003    (JP) .............................. 2003-033324

(51) Int. Cl.
*F16L 27/00* (2006.01)
(52) U.S. Cl. .................... 285/273; 285/98; 285/106; 285/190; 285/121.6; 285/281
(58) Field of Classification Search .................. 285/96, 285/98, 190, 273, 281, 106, 121.1, 121.3, 285/121.6, 10–11
See application file for complete search history.

(56) References Cited

U.S. PATENT DOCUMENTS

| 2,614,793 | A | * | 10/1952 | Storm ........................ 137/860 |
| 2,768,843 | A | | 10/1956 | Zeilman |
| 5,439,029 | A | * | 8/1995 | Becker ........................ 137/580 |
| 5,685,214 | A | | 11/1997 | Neff et al. |
| 5,957,462 | A | | 9/1999 | Nishiyama et al. |
| 6,073,681 | A | | 6/2000 | Getchel et al. |
| 2001/0045705 | A1 | | 11/2001 | Hashimoto |

FOREIGN PATENT DOCUMENTS

| JP | 1-146063 | 10/1989 |
| JP | 06-240561 | 8/1994 |
| JP | 09-253951 | 9/1997 |
| JP | 10-038092 | 2/1998 |
| JP | 2000-130595 | 5/2000 |
| JP | 2000-274539 | 10/2000 |

* cited by examiner

*Primary Examiner*—Aaron M Dunwoody
*Assistant Examiner*—Fannie Kee
(74) *Attorney, Agent, or Firm*—McCormick, Paulding & Huber LLP

(57) ABSTRACT

A rotating table provided with a determined gap Db and serving as a rotating body is rotatably mounted on a fixed base. Seal-member accommodating spaces serving as annular grooves are partitioned and formed in a fixed surface. Annular seal members are disposed in the seal-member accommodating spaces. When a vacuum is supplied to a communication passage, the absorbed seal members contact with the fixed surface and a rotated surface to seal gaps therebetween. When a positive pressure is supplied to the communication passage, the seal members are relocated in the seal-member accommodating spaces. The seal-member accommodating space has a taper portion, thereby preventing the seal members from biting. While the rotating table is being rotatably driven, no vacuum is supplied to the communication passage.

5 Claims, 7 Drawing Sheets

VACUUM FEEDING JOINT

CROSS REFERENCE TO RELATED APPLICATIONS

This application claims the benefit of PCT Application No. PCT/JP2004/001392, filed on Feb. 10, 2004 and Japanese Patent Application No. 2003-33324, filed Feb. 12, 2003, the disclosures of which are herein incorporated by reference in their entirety.

TECHNICAL FIELD

The present invention relates to a vacuum feeding joint for supplying a vacuum between a fixed base and a rotating body rotatably mounted thereon.

BACKGROUND OF THE INVENTION

Some conveyance devices for precise fine workpieces such as semiconductor chips are of a type which mounts the fine workpieces on an upper surface of a rotating table serving as a rotating body to convey them up to a target position and concurrently exerts their processes or inspections in each mounting state. Thereamong, a vacuum feeding joint, in which an air adsorption section is provided on the upper surface of the rotating table and a vacuum feeding source is connected to the fixed base supporting the rotating table, is known as the above-described conveyance device capable of mounting the fine workpieces on the upper surface of the rotating table with high precision. In the vacuum feeding joint, a communication passage for communicating with the air adsorption section and the vacuum feeding source is formed in each of the rotating table and the fixed base, whereby the fine workpieces mounted on the air adsorption section can be adsorbed and fixed with high precision.

In the above-mentioned vacuum feeding joint, to be capable of supplying a vacuum even if the rotating table is rotated at any angle, an annular communication groove, in which a rotating shaft of the rotating table serves as a center, is formed in at least one of a bottom surface of the rotating table and the upper surface of the fixed base and, concurrently, a communication passage communicating with the air adsorption section and a communication passage communicating with the vacuum feeding source are opened on a circumference of the annular communication groove, respectively. Additionally, seal members contacting with the rotating table and the fixed base are mounted on an outer-circumference side and an inner-circumference side of the annular communication groove, whereby the seal members ensure airtightness of the communication passages.

However, if the seal members are thus mounted, friction is caused in rotate-driving the rotating table, so that it is difficult to smoothly rotate the rotating table at a precise rotating angle.

An object of the present invention is to provide a vacuum feeding joint capable of ensuring the airtightness in the communication passages during the feeding of a vacuum supplying and suppressing an occurrence of friction during the rotate-driving of the rotating body.

SUMMARY OF THE INVENTION

A vacuum feeding joint according to the present invention comprises: a fixed base in which a vacuum port for connecting a vacuum feeding source is formed; a rotating body rotatably mounted on the fixed base, having a rotated surface opposite to a fixed surface of the fixed base through a gap, and having a vacuum port formed therein; a communication passage formed in each of the fixed base and the rotating body and communicating with two of the vacuum ports through the gap; a seal-member accommodating space partitioned and formed by the fixed surface and the rotated surface; and a seal member disposed in the seal-member accommodating space, being away from at least one of the fixed surface and the rotated surface during a stop of a vacuum feeding to the communication passage, and contacting with the fixed surface and the rotated surface to seal the gap during the vacuum feeding to the communication passage.

In the vacuum feeding joint according to the present invention, the seal-member accommodating space is an annular groove formed in at least one of the fixed surface and the rotated surface, and the seal member is a seal member whose cross-sectional diameter is larger than the gap in an edge close to an opening of the communication passage in the annular groove and smaller than the gap in the annular groove.

In the vacuum feeding joint according to the present invention, the annular groove is deeper as being further from the communication passage.

In the vacuum feeding joint according to the present invention, the fixed surface and the rotated surface are surfaces perpendicular to a rotating-shaft center of the rotating body.

In the vacuum feeding joint according to the present invention, the fixed surface and the rotated surface are a rotating-body side surface in which a rotating-shaft center of the rotating body serves as a central axis.

According to the present invention, since the seal members during the stop of the vacuum feeding are away from at least one of the rotated surface and the fixed surface and no friction occurs, a loss of a rotational driving force of the rotating body is reduced and a smooth rotation thereof can be made at a precise rotating angle.

According to the present invention, since the seal members during the vacuum feeding contact with the rotated surface and the fixed surface to seal the gap therebetween, the airtightness in the communication passage is ensured and the vacuum can be effectively supplied.

According to the present invention, the seal-member accommodating space for accommodating each of the seal members is an annular groove whose depth is larger as it is further from the communication passage, so that the seal members can be prevented from being inserted between the fixed base and the rotating body when the positive pressure is supplied into the communication passage.

DESCRIPTION OF PREFERRED EMBODIMENTS

Figure 1:
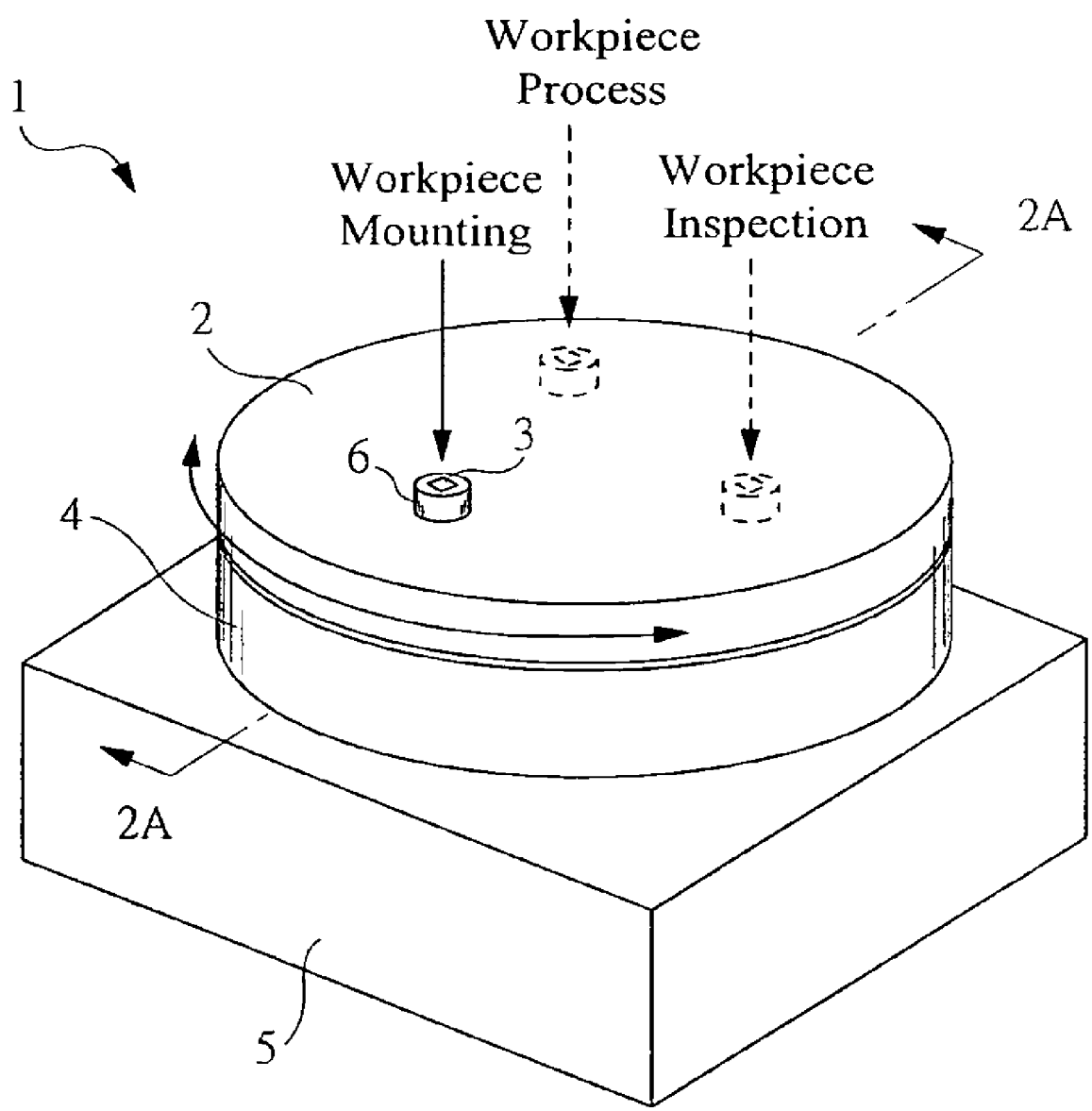
FIG. 1 is a perspective view showing a workpiece conveyance table that is an embodiment according to the present invention.

FIG. 1 is a perspective view showing a workpiece conveyance table provided with a vacuum feeding joint according to an embodiment of the present invention. A workpiece conveyance table 1 carries, by rotating a rotating table 2 serving as a rotating body, a fine workpiece 3 such as a semiconductor chip mounted on an upper surface thereof up to a target position such as a workpiece inspecting position and a workpiece processing position, wherein it includes: the rotating table 2 on which a workpiece bench 6 serving as an air adsorption section is provided; a fixed base 4 on which the rotating table 2 is rotatably mounted; and a support 5 for supporting the fixed base 4 from below.

The fine workpiece 3 is mounted on the upper surface of the work bench 6 by an external conveyance device unshown and is carried up to the above predetermined position by rotating the rotating table 2 using a drive unit unshown. The fine workpiece 3 is not adsorbed to the work bench 6 when being rotated and carried, but is absorbed to the work bench 6 due to a rotation stop of the rotating table 2 and vacuum supplied from a vacuum feeding source unshown at the time of placement requiring fixing the fine workpiece 3 with high precision or of its inspection and process.

Figure 2A:
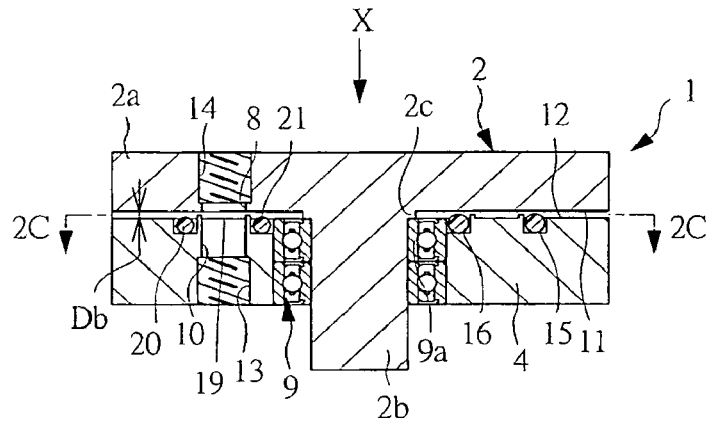
FIG. 2A is a partial sectional view taken in a direction extending along line 2A-2A in FIG. 1.
Figure 2B:
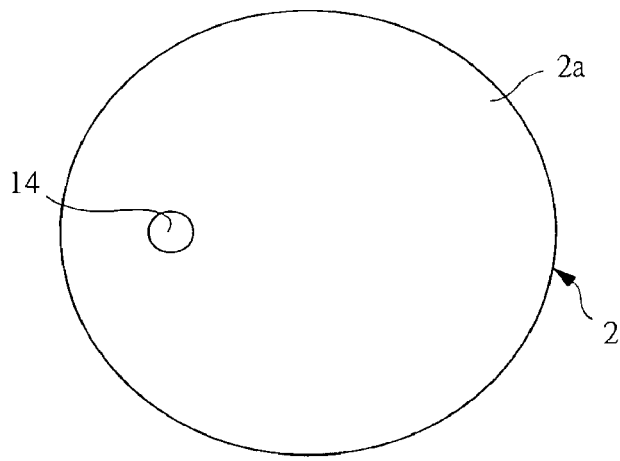
FIG. 2B is a view viewed from an X direction of FIG. 2A.
Figure 2C:
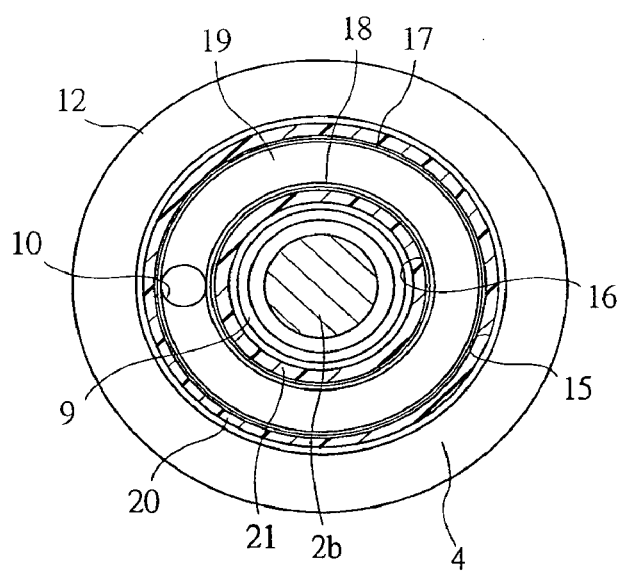
FIG. 2C is a sectional view taken in a direction extending along line 2C-2C in FIG. 2A.

FIG. 2A is a partial sectional view taken in a direction extending along line 2A-2A in FIG. 1, FIG. 2B is a view viewed from an X direction in FIG. 2A, and FIG. 2C is a sectional view taken in a direction extending along line 2C-2C in FIG. 2A. As shown in FIG. 2A, the rotating table 2 includes a disk-shaped table body 2a and a cylindrical table rotating shaft 2b to be mounted on the fixed base 4. Two ball bearings 9 are incorporated into the fixed base 4, thereby rotatably supporting the table rotating shaft 2b. A rotated-side communication passage 8 is formed in the table body 2a so as to pass axially through it, and a fixed-side communication passage 10 is formed in the fixed base 4 so as to open to the rotated-side communication passage 8 and pass axially through it. A fixed surface 12 of the fixed base 4 and a rotated surface 11 of the rotating table 2 opposite to the fixed surface 12 through a predetermined gap are surfaces perpendicular to a rotating-shaft center of the rotating table 2. Note that the number of ball bearings 9 can be increased or reduced as occasion demands.

In the rotating table 2, an annular projection 2c is formed at a corner where the rotated surface 11 of the table body 2a and an outer peripheral surface of the table rotating shaft 2b intersect. Since the annular projection 2c is engaged with an inner race 9a of the ball bearing 9, the rotating table 2 is rotatably supported. Concurrently, since depth of insertion of the table rotating shaft 2b is regulated, a gap between the rotated surface 11 and the fixed surface 12 is set to a dimension of Db.

An input-side vacuum port 13 is provided in an opening opened toward the support 5 of the fixed side communication passage 10. An output-side vacuum port 14 is provided in an opening opened on the upper surface of the rotating table 2 in the rotated-side communication passage 8. The workpiece bench 6 as shown in FIG. 1 is connected to the vacuum port 14. The vacuum feeding source unshown is connected to the vacuum port 13. The vacuum inputted from the vacuum port 13 is outputted to the vacuum port 14 through the fixed-side communication passage 10, the gap between the fixed surface 12 and the rotated surface 11, and the rotated side communication passage 8, thereby adsorbing the fine workpiece 3 mounted on the workpiece bench 6.

Figure 3A:
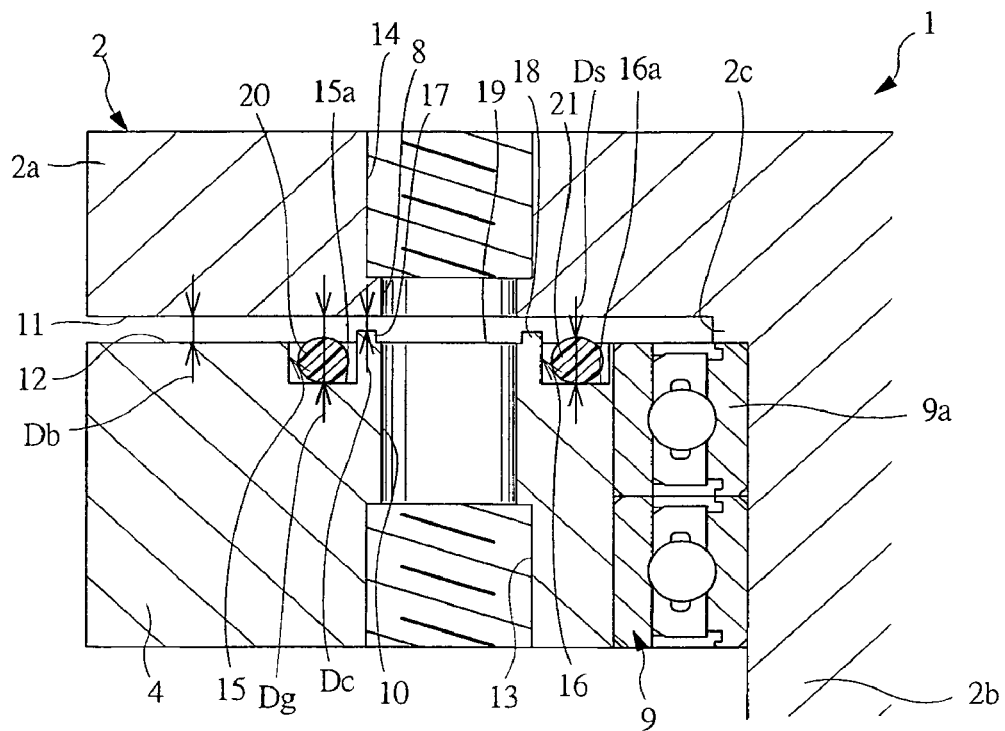
FIG. 3A is an explanatory view showing a deforming state of seal members during a stop of a vacuum feeding.
Figure 3B:
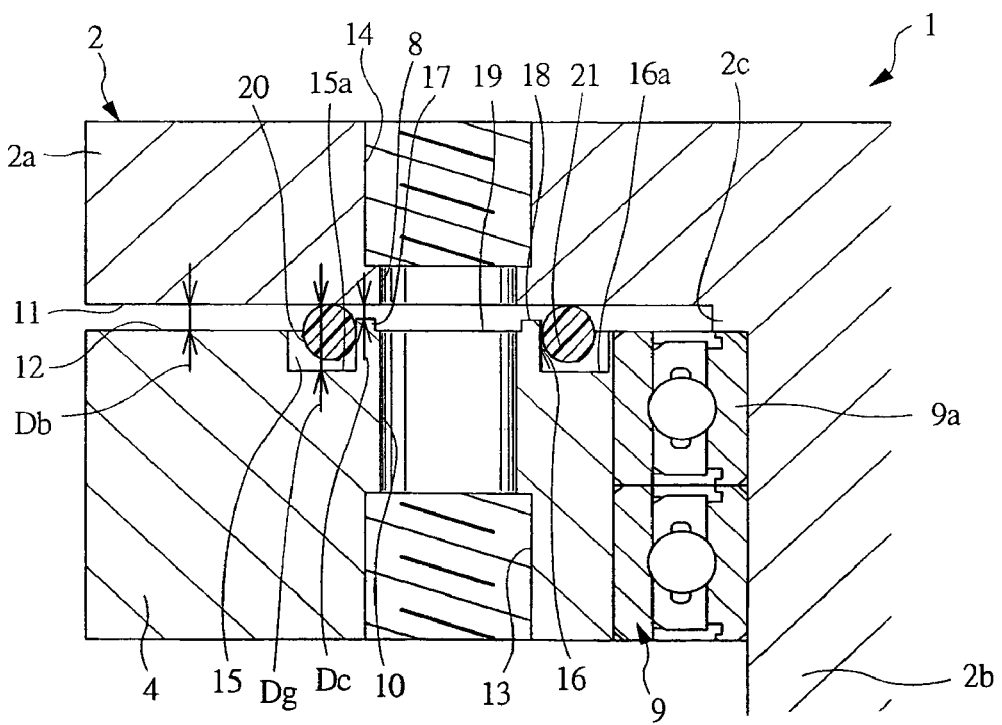
FIG. 3B is an explanatory view showing the deforming state of the seal members during the vacuum feeding.

FIG. 3A is an explanatory view showing a deforming state of a seal member during a stop of the vacuum feeding and FIG. 3B is an explanatory view showing a deforming state of the seal member during the vacuum feeding. Annular seal-member accommodating spaces 15 and 16, in which a rotating-shaft center of the rotating body 2 serves as a center, are partitioned and formed in the fixed surface 12 so that the fixed-side communication passage 10 is sandwiched therebetween. Annular projections 17 and 18 projecting toward the rotated surface 11 from a side close to the opening of the fixed-side communication passage 10 are formed in the annular seal member accommodating spaces 15 and 16, respectively. An annular communication groove 19 is formed within a range sandwiched between the two annular projections 17 and 18 on the fixed surface 12. The annular communication groove 19 nearly coincides with a circular locus drawn by the opening of the rotated-side communication passage 8 since the rotating table is rotated. The rotated-side communication passage 8 and the fixed side communication passage 10 always communicate with the annular communication groove 19 even if the rotating table 2 is rotated at any angle.

Annular seal members 20 and 21 are disposed in the seal-member accommodating spaces 15 and 16, respectively. These seal members 20 and 21 are made of elastic materials, wherein each cross-sectional diameter Ds of the seal members 20 and 21 is set larger than a gap dimension Dc between each of the annular projections 17 and 18 and the rotated surface 11 and smaller than a gap dimension Dg between each of bottom surfaces 15a and 16a of the seal-member accommodating spaces 15 and 16 and the rotated surface 11. That is, the seal members 20 and 21 are disposed with predetermined margins in the seal-member accommodating spaces 15 and 16, respectively, and particularly move away from the rotated surface 11 during a stop or interruption of the vacuum feeding (see FIG. 3A), so that the rotating table 2 can be smoothly rotated with a precise angle without causing friction between the rotated surface 11 and each of the seal members 20 and 21.

Meanwhile, since an inside of the annular communication groove 19 becomes in a negative pressure state during the vacuum feeding, each of the seal members 20 and 21 is deformed and moved so as to be absorbed into the gap Dc between the rotated surface 11 and each of the annular projections 17 and 18 (see FIG. 3B). Consequently, each of the seal members 20 and 21 contacts with both of the rotated surface 11 and the annular projections 17 and 18 of the fixed surface 12 to seal the gap Dc therebetween, thereby sealing hermetically the annular communication groove 19. By doing so, the fixed-side communication passage 10 and the rotated-side communication passage 8 airtightly communicate with each other through the sealed annular communication groove 19. Therefore, since a leakage of air under the negative pressure is reduced, the vacuum can be effectively supplied.

When the gap Db between the fixed surface 12 and the rotated surface 11 is sufficiently narrower than each cross-sectional diameter Ds of the seal members 20 and 21, it is not required to form the annular projections 17 and 18. Even in this case, by attaching the seal members 20 and 21 to the gap Db between the fixed surface 12 and the rotated surface 11 during the vacuum feeding, the circular communication passage 19 can be hermetically sealed. Additionally, when the rotating table 2 is intended to be stopped, the vacuum is supplied to contact the seal members 20 and 21 with the rotated surface 11 and the annular projections 17 and 18 of the fixed surface 12, whereby they may serve as brakes to stop a rotational operation of the rotating table 2.

When the rotating table 2 is rotated after the vacuum feeding, the seal members 20 and 21 contacting with the fixed surface 12 and the rotated surface 11 are required to be relocated in the seal-member accommodating spaces 15 and 16. However, since a device temperature rises by using the workpiece conveyance table 1, the seal members 20 and 21 made of elastic materials easily bite into projections such as the annular projections 17 and 18, so that they are not disposed into the seal-member accommodating spaces 15 and 16 only by resilience the seal members 20 and 21 have in some cases. In this case, a positive pressure is supplied from a positive-pressure supplying source unshown to the annular communication groove 19 in order to surely relocate the seal members 20 and 21 in the seal-member accommodating spaces 15 and 16, whereby pressure control for pressing the seal members 20 and 21 by a differential pressure between it and an external pressure is executed.

Figure 4A:
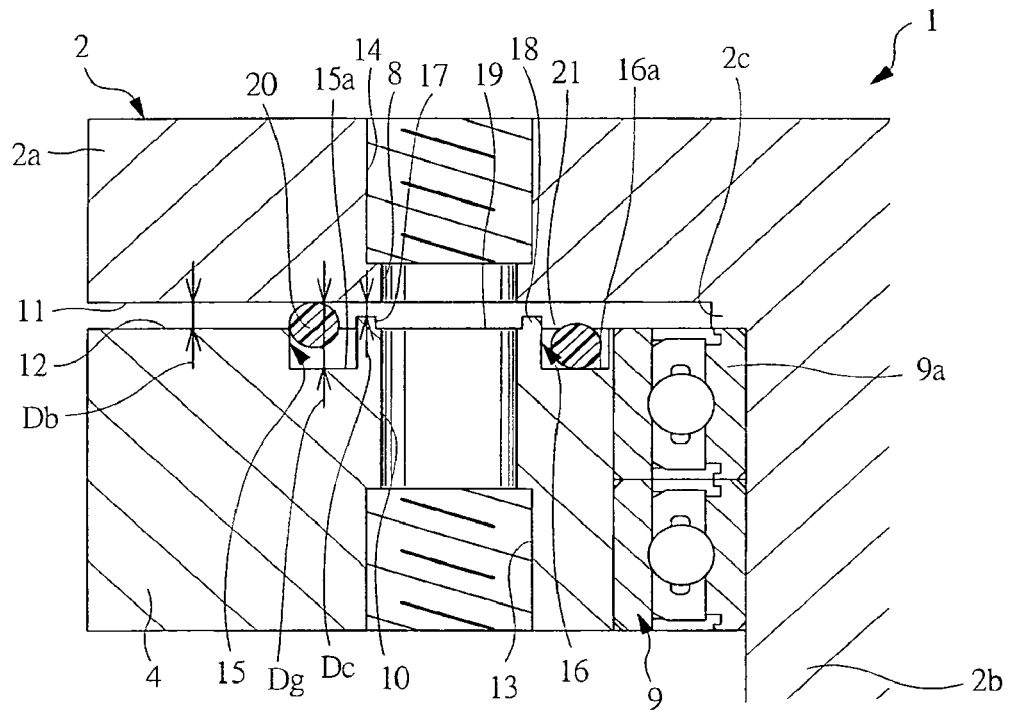
FIG. 4A is an explanatory view showing a deforming state of a seal member during a positive pressure feeding.
Figure 4B:
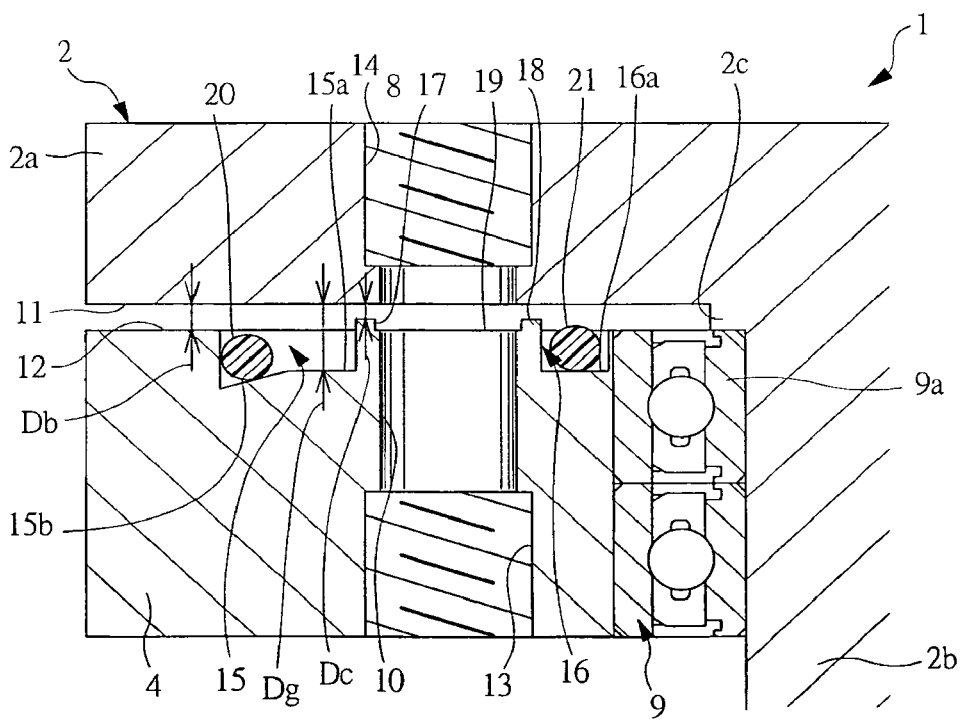
FIG. 4B is a sectional view showing another embodiment of a seal-member accommodating space.

FIG. 4A is an explanatory view showing a deforming state of the seal member during a positive-pressure supply, and FIG. 4B is a sectional view showing another embodiment of the seal-member accommodating space. As shown in FIG. 4A, when the seal members 20 and 21 are not disposed in the seal-member accommodating spaces 15 and 16 while the positive pressure is supplied to the annular communication groove 19, there is a possibility that the seal members 20 and 21 will be inserted between the fixed base 4 and the rotating table 2. Therefore, as shown in FIG. 4B, a taper portion 15$b$, whose depth is larger as it is further from the communication passage, is formed in a bottom portion of the seal-member accommodating space 15 serving as an annular groove and a vent of air under the positive pressure is ensured in an upper portion of the seal member having been deformed by the positive pressure, so that the seal members 20 and 21 can be prevented from being inserted between the fixed base 4 and the rotating table 2. The same taper portion can be formed also in the seal-member accommodating space 16, although not illustrated for convenience of the drawings.

Figure 5:
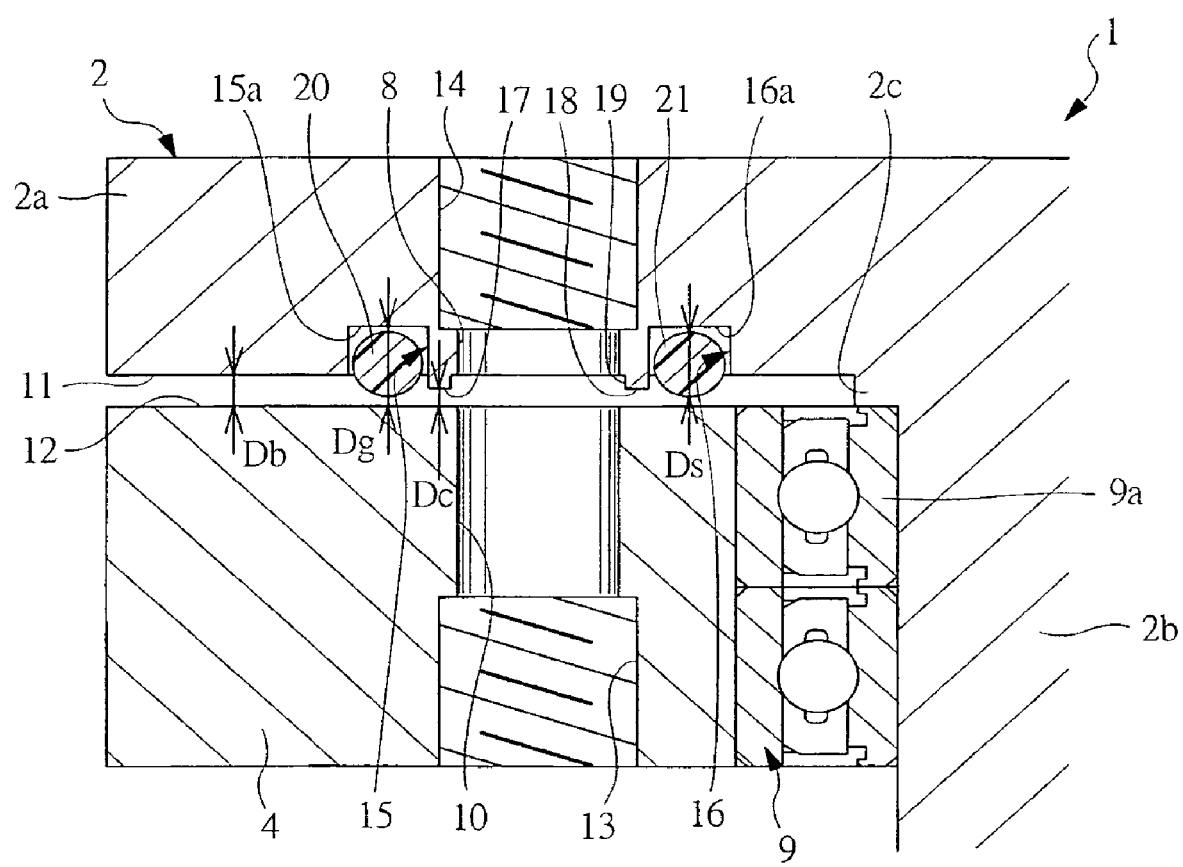
FIG. 5 is a sectional view showing a vacuum feeding joint according to another embodiment of the present invention.

Locations for forming the seal-member accommodating spaces 15 and 16 are not limited to the fixed surface 12 and, as shown in FIG. 5, may be in the rotated surface 11. Similarly thereto, they may be formed in both of the fixed surface 12 and the rotated surface 11. In either case, the seal members 20 and 21 to be disposed in the seal-member accommodating spaces 15 and 16 require being formed by such dimensions as to include predetermined margins. Additionally, the annular projections 17 and 18 require being provided so that the seal members 20 and 21 contact with both of the fixed surface 12 and rotated surface 11, except for when the gap Db between the fixed surface 12 and the rotated surface 11 is sufficiently narrower than each cross-sectional diameter Ds of the seal members 20 and 21.

Figure 6A:
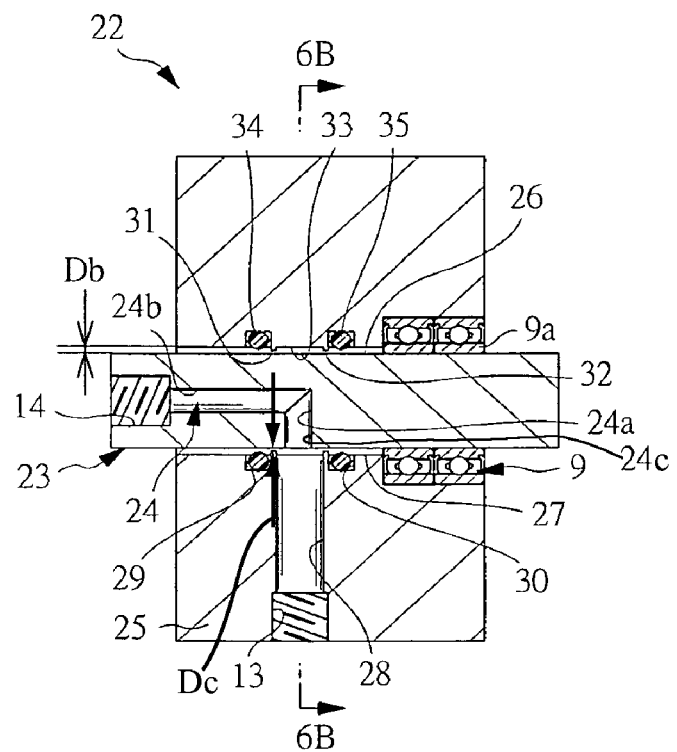
FIG. 6A is a sectional view showing a vacuum feeding joint according to another embodiment of the present invention.
Figure 6B:
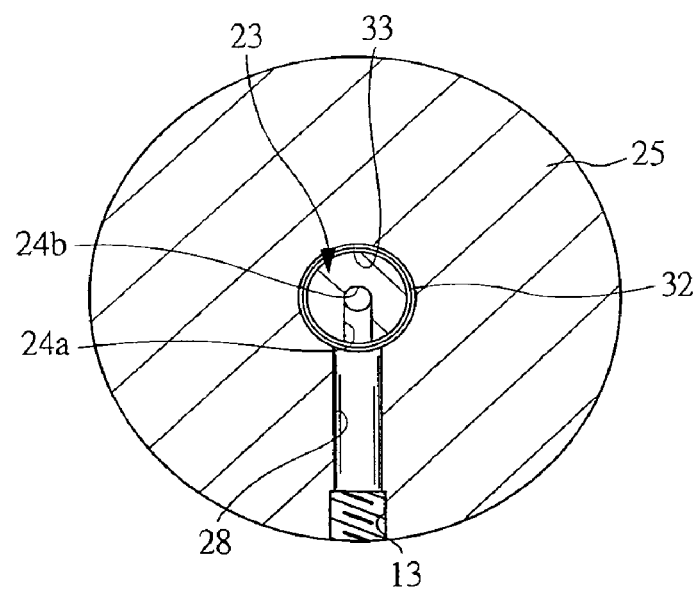
FIG. 6B is a sectional view taken in a direction extending along line 6B-6B in FIG. 6A.

FIG. 6A is a sectional view showing a vacuum feeding joint according to another embodiment of the present invention, and FIG. 6B is a sectional view taken in a direction extending along line 6B-6B in FIG. 6A. In these Figures, members or shapes common to those shown in FIG. 2 are denoted by the same reference numeral.

A vacuum feeding joint 22 includes a fixed base 25 formed in a cylindrical shape with a large diameter and a rotating shaft 23 formed in a cylindrical shape with a small diameter and rotatably mounted in the fixed base 25 through the ball bearings 9. A rotated-side communication passage 24, composed of a radial communication passage 24$a$ extending radially from a shaft center at a middle position in an axis direction to a vacuum port 24$c$ at an outer peripheral surface of the shaft 23 and an axial communication passage 24$b$ extending from the radial communication passage 24$a$ to an output-side vacuum port 14 at one end of the rotating shaft 23 on the shaft center, is formed in the rotating shaft 23. Meanwhile, a fixed-side communication passage 28, extending in a radial direction of the fixed base 25 at the same axial position as that of the radial communication passage 24$a$, is formed in the fixed base 25.

An inner peripheral surface 27 of the fixed base 25 serves as a fixed surface and the outer peripheral surface 26 of the shaft 23 serves as a rotated surface. A center of the rotating shaft 23 serves as a central axis. A gap Db between the rotated surface 26 and the fixed surface 27 is equal to a difference between a radius of the inner race 9$a$ in the ball bearing 9 and a radius of the fixed surface 27. Note that the number of ball bearings 9 may be increased or reduced as occasion demands.

An input-side vacuum port 13 is provided in an opening on an outer-circumference side of the fixed-side communication passage 28, and communicates with the output-side vacuum port 14 through the communication passages 24 and 28. Seal accommodating spaces 29 and 30 are partitioned and formed in the fixed surface 27 so that an opening of the fixed-side communication passage 28 is sandwiched therebetween. Annular projections 31 and 32 projecting toward the rotated surface 26 are formed on an edge close to the opening of the fixed-side communication passage 28 in the seal-member accommodating spaces 29 and 30. A range sandwiched between the annular projections 31 and 32 on the fixed surface 27 forms an annular communication groove 33. The annular communication groove 33 nearly coincides with a circular locus drawn by the vacuum port 24$a$ when the rotating shaft 23 is rotated, so that the radial communication passage 24$a$ and the fixed-side communication passage 28 always communicate with each other through the annular communication groove 33 even if the rotating shaft 23 is rotated at any angle. Seal members 34 and 35 are disposed in the seal-member accommodating spaces 29 and 30 with predetermined margins, respectively. Dimensional relations between the cross-sectional diameters of the seal members 34 and 35 and the respective gaps are the same as those shown in FIG. 3.

In such a vacuum feeding joint 22, while the vacuum feeding is stopped and the rotating shaft 23 is rotated, each of the seal members 34 and 35 is away from the rotated surface 26 and no friction occurs, so that a loss of a rotational driving force is reduced and the rotating shaft 23 can be smoothly rotated at a precise rotational angle. Meanwhile, while the rotation of the rotating shaft 23 is stopped and the vacuum is supplied, each of the seal members 34 and 35 is absorbed and the gaps between the rotated surface 26 and the annular projections 31 and 32 of the fixed surface 27 are sealed due to seal movement similar to that illustrated in FIG. 3B, whereby airtightness of the annular communication groove 33 can be ensured.

Figure 7:
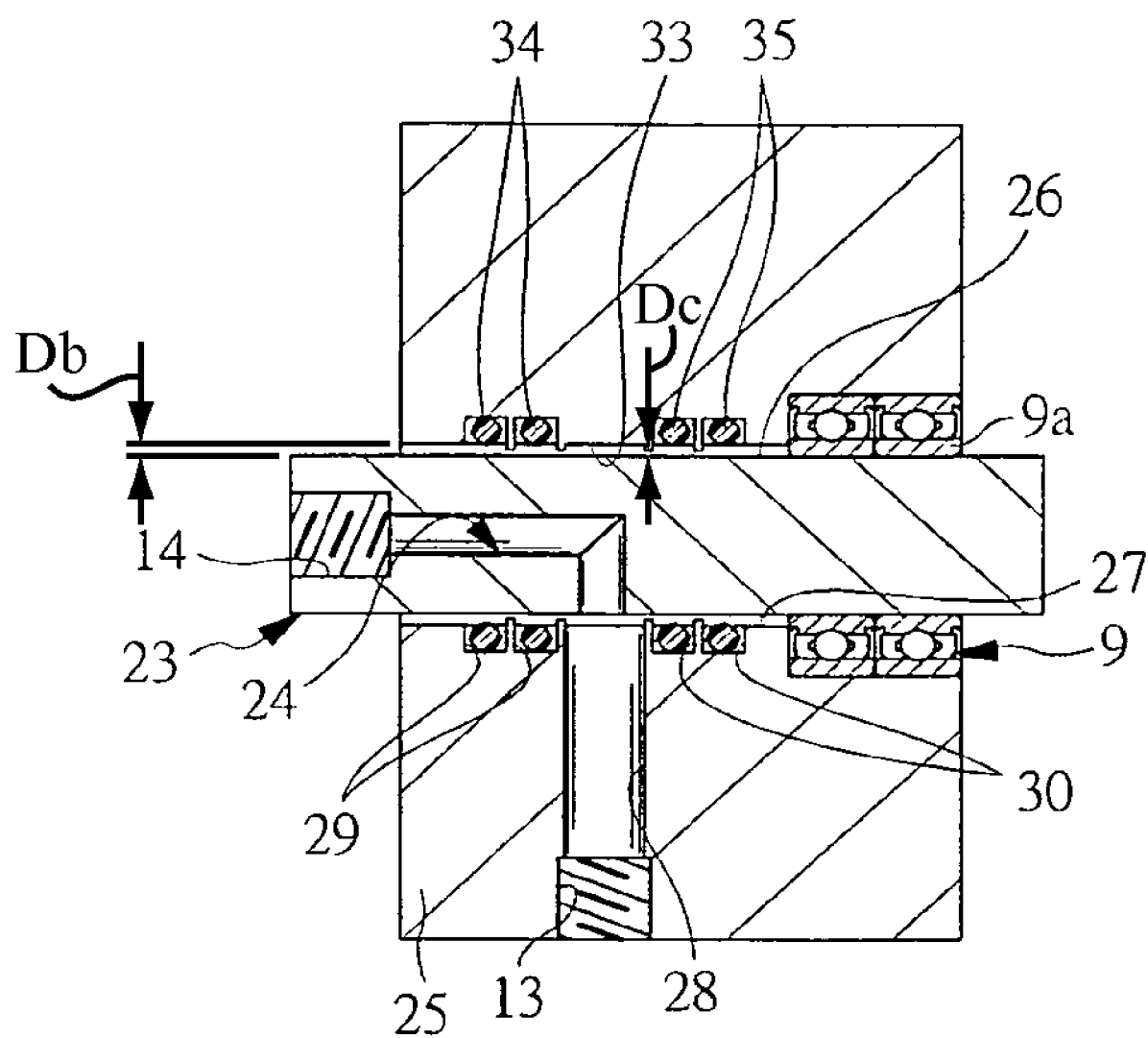
FIG. 7 is a sectional view showing a vacuum feeding joint according to another embodiment of the present invention.

Note that the seal-member accommodating spaces 29 and 30 may be partitioned and formed in the rotated surface 26 and the annular projections 31 and 32 may not be formed when the gap Db between the fixed surface 27 and the rotated surface 26 is sufficiently narrower than the cross-sectional diameters Ds of the seal members 34 and 35. Additionally, the fixed surface 27 and the rotated surface 26 do not require being formed into cylindrical shapes if they are a rotating-body side surface in which a rotating-shaft center of the rotating body serves as a central axis. For example, each of the fixed surface 27 and the rotated surface 26 may be formed into a side surface of a cone. As shown in FIG. 7, as a modified example of the vacuum feeding joint 22, the annular communication groove 33 can be also hermetically sealed with further higher airtightness by increasing the number of seal members 34 and 35 to be disposed.

The present invention is not limited to the above-mentioned embodiments and may be variously modified and altered without departing from the gist thereof. For example, a cross-section shape of the seal member is not limited to a circle, and a seal member formed into a V or C shape may be also used. Especially, if an opening formed on the V shape or on the right side of the C shape has such a cross-section shape as to be directed to an outer circumference of a ring, reactivity of deformation with respect to switching between the supply and stop of vacuum is improved. The present invention can be also applied to a vacuum feeding joint, in which the input-side vacuum port is provided in the rotating body and the output-side vacuum port is provided in the fixed base and the vacuum is supplied from the rotating body to the fixed base.

INDUSTRIAL APPLICABILITY

The present invention can be applied to a workpiece conveyance device for mounting the fine workpieces such as semiconductor chips on the upper surface of the rotating table to carry them to the target position and for processing and inspecting them while they are adsorbed in vacuum.

The invention claimed is:

1. A vacuum feeding joint for sealing a stream of vacuum between a fixed base and a rotating body rotatably mounted on said fixed base, the joint comprising:
   a fixed surface on said fixed base defining a first vacuum port;
   a rotated surface on said rotating body, the rotated surface being rotated with the body about an axis of rotation relative to said fixed surface and positioned opposite said fixed surface to form a gap between the surfaces, said rotated surface defining a second vacuum port;
   first and second annular seal member accommodating spaces circumscribing the axis of rotation and being formed in one of said fixed and rotated surfaces so as to straddle one of said first and second vacuum ports;
   first and second annular seal members disposed respectively in the first and second seal-member accommodating spaces;
   an annular communication groove formed between the annular seal accommodating spaces so as to closely coincide with a circular locus drawn on said fixed surface by an opening of said second vacuum port when said rotating body is rotated,
   said gap being narrower than each cross-sectional diameter of said first and second seal members, such that said first and second seal members move toward the other of said fixed and rotated surfaces at vacuum feeding from said first vacuum port to said second vacuum port and close said gap to seal members are released from the other of said fixed and rotated surfaces and open said gap to unseal said annular communication groove at termination of the vacuum feeding.

2. The vacuum feeding joint according to claim 1, wherein said fixed surface and said rotated surface are surfaces of revolution in which the axis of rotation of said rotating body serves as the axis of revolution, and the opening portion of said second vacuum port is a vacuum port formed in an outer peripheral surface of said rotating body.

3. The vacuum feeding joint according to claim 1, wherein the first vacuum port also receives a positive pressure to be supplied to said annular communication groove to press said seal members back to said seal-member accommodating spaces after the termination of the vacuum feeding to said ports.

4. The vacuum feeding joint according to claim 1, wherein said seal members have a cross section smaller than the distance between the bottom of said seal-member accommodating spaces and the other of said fixed surface and said rotated surface.

5. A vacuum feeding joint for sealing a stream of vacuum between a fixed base and a rotating body rotatably mounted on said fixed base, the joint comprising:
   a fixed surface on said fixed base defining a first vacuum port;
   a rotated surface on said rotating body, the rotated surface being rotated with the rotating body about an axis of rotation relative to said fixed surface and positioned opposite said fixed surface to form a first gap between the surfaces, the rotated surface defining a second vacuum port;
   first and second annular seal-member accommodating spaces circumscribing the axis of rotation and being formed in one of said fixed and rotated surfaces so as to straddle one of said first and second vacuum ports;
   first and second annular seal member disposed respectively in the first and second seal-member accommodating spaces;
   first and second annular projections provided on one of said fixed and rotated surfaces located and straddling one of said first and second vacuum ports so as to project toward the other of said fixed and rotated surfaces and to defined, between the first and second annular projections and the other of the fixed and rotated surfaces, a second gap; and
   an annular communication groove formed between the first and second annular projections so as to closely coincide with a circular locus drawn on said fixed surface by said second vacuum port when said rotating body is rotated,
   wherein said second gap is narrower than each cross-sectional diameter of said first and second seal members, whereby said first and second seal members can move toward the other of said fixed and rotated surfaces at vacuum feeding from said first vacuum port to said second vacuum port and close said second gap to seal hermetically said annular communication groove, and said first and second seal members are released from the other of said fixed and rotated surfaces and open said second gap to unseal annular communication groove at termination of the vacuum feeding.

* * * * *